(12) United States Patent
Mansfield et al.

(10) Patent No.: US 6,526,164 B1
(45) Date of Patent: Feb. 25, 2003

(54) INTELLIGENT PHOTOMASK DISPOSITION

(75) Inventors: Scott Marshall Mansfield, Hopewell Junction, NY (US); Alfred Kwok-Kit Wong, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/320,901

(22) Filed: May 27, 1999

(51) Int. Cl.[7] ................................................. G06K 9/00
(52) U.S. Cl. ....................... 382/144; 382/147; 382/149; 356/237.1; 356/237.2; 356/237.4; 356/394; 430/5; 430/22; 430/30
(58) Field of Search ................................ 382/144, 147, 382/148, 149; 356/237.47, 390, 394, 239.8, 237.4, 237.1, 394.5, 237.2, 237.3, 237.5, 237.7, 238.8; 324/501, 537; 348/125, 126; 430/5, 22, 30

(56) References Cited

U.S. PATENT DOCUMENTS

| | | | | |
|---|---|---|---|---|
| 4,442,188 A | * | 4/1984 | Chiang | 356/401 |
| 5,256,505 A | * | 10/1993 | Chen et al. | 378/35 |
| 5,362,585 A | * | 11/1994 | Adams | 430/311 |
| 5,707,765 A | * | 1/1998 | Chen | 430/296 |
| 5,965,306 A | * | 10/1999 | Mansfield et al. | 430/5 |
| 6,175,645 B1 | * | 1/2001 | Elyasaf et al. | 356/237.4 |

* cited by examiner

*Primary Examiner*—Leo Boudreau
*Assistant Examiner*—Sheela Chawan
(74) *Attorney, Agent, or Firm*—H. Daniel Schnurmann

(57) ABSTRACT

A method for determining whether a defect that is detected by photomask inspection will adversely affect a semiconductor device, such as a wafer. The method has the ability of relating defect specifications directly to device performance and wafer yields, and assessing the impact of combining the defect with the critical dimension error using standard inspection tools. More specifically, the method includes the steps of: inspecting the photomask for defects; measuring the size and location of the defects relative to features on the photomask; classifying the defects by type of defect; assigning an equivalent mask critical dimension error (EME) value to each of the features based on size, location and type of defect; assigning a total mask error to each of the features by adding EME values to each defect impacting the features; and comparing the equivalent critical dimension error to a mask critical dimension error tolerance to determine whether the defects adversely affect the performance of the semiconductor device.

27 Claims, 10 Drawing Sheets

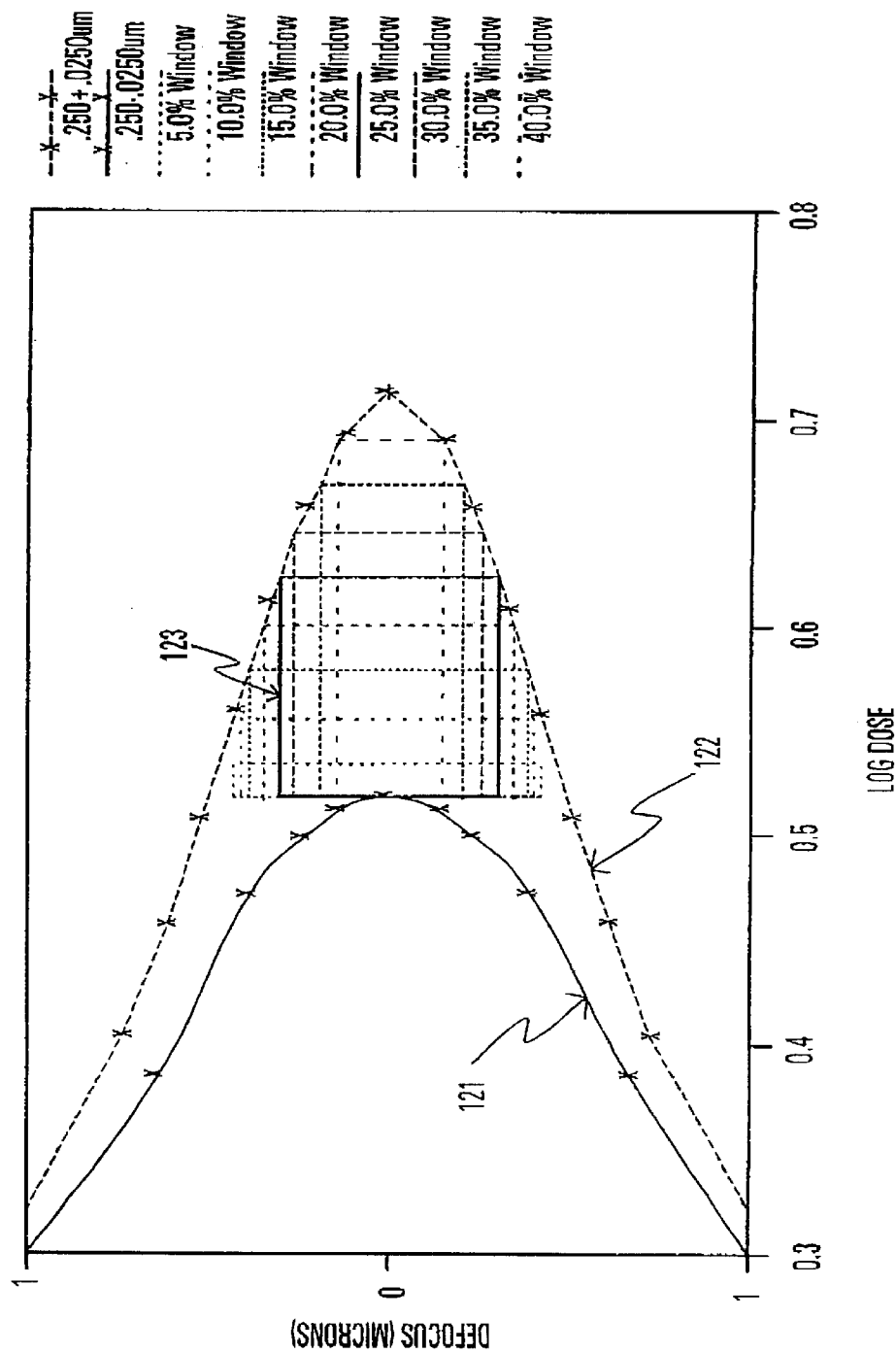

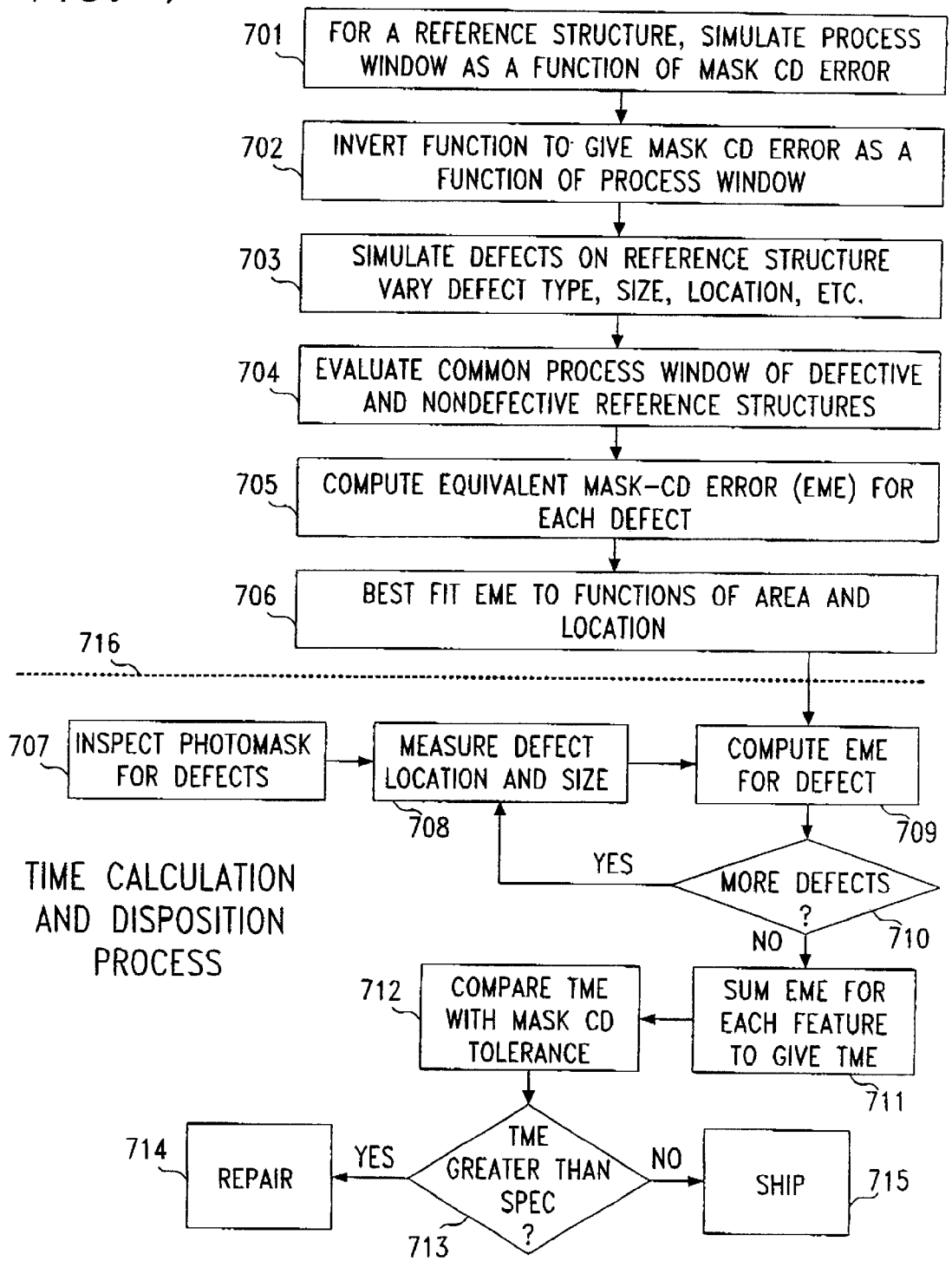

INTELLIGENT PHOTOMASK DISPOSITION

FIELD OF THE INVENTION

This invention relates, generally, to a photomask inspection process, and more particularly, to a method of determining the impact of a defect of a certain size and location on the photomask, as well as the impact of combining the defect with the critical dimension error using standard inspection tools.

BACKGROUND OF THE INVENTION

In a typical mask making process, all defects that are found on the photomask during the inspection process must be repaired. For a given defect type, most specifications are typically based on size. Accordingly, inspection tools are tuned to only finding defects that are larger than a specified minimum defect size. It is known in the art that not all defects cause problems during the lithography process. A defect on a photomask is deemed harmful only if the image of the defect is transferred to the wafer during the lithographic printing process. If the defect is not imaged onto the wafer, then the mask maker may not be required to repair the defect altogether, thereby saving time and money. Moreover, if the defect is imaged onto the wafer in a way that it does not adversely effect the performance of the wafer, then this defect is preferably left untouched.

The process of determining whether or not the mask manufacturer can ship a photomask to a customer (or "dispose of" the mask) is often referred to as the disposition of the photomask. This disposition is based on whether or not the mask is complete and meets its specifications. Likewise, when the inspection sector of a mask manufacturer decides whether or not a defect can be passed as acceptable (or "disposed of") this process is often referred to as the disposition of the defect. Furthermore, the inspection sector may summarize the decisions made for each individual defect as the disposition of the photomask for that sector. It is this act of the inspection sector deciding whether or not the mask must first be sent for repair before proceeding with the mask making process that we will refer to as the disposition of the mask.

The difficulty in classifying defects as described is that the mask maker is not typically provided with a good methodology for determining what defects will adversely affect the wafer. Defects that are close to a critical feature may have an impact on the feature depending on several factors that include: feature type, proximity of the defect to the feature, and the size, shape, phase and transmission of the defect. These effects are further complicated when enhancement techniques, such as phase-shifting masks and optical proximity correction, are utilized. Since defects are traditionally classified by type (e.g., a hole in the chrome) as well as by their size (relative to the critical feature size on the mask), current defect specifications are becoming increasingly difficult to be met, as the size of the critical features on the mask continues to shrink to below 1.0 µm. This difficulty will likely drive the need for new and more expensive inspection and repair tools, and will lower the achievable yields on advanced photomasks. The end result of the upgrade in tooling translates into an increased cost per mask.

Since photomask inspection tools typically use an optical system that is significantly different than the lithography exposure system, the inspection tool cannot in general predict the effect of the defect on the image transferred to the wafer. It is believed, however, that the inspection systems can find most defects that negatively impact the wafer performance along with those that do not. Since repairs are expensive, certain categories of defects cannot be repaired and some repairs may end up making the defect worse, it is desirable to concentrate on those defects that ultimately will cause problems on the wafer.

To understand the methodology of the invention, one must first have a basic understanding of the "process window" for lithographically printing a feature. The process window for a given feature is the amount of variation in the process that can be tolerated while still maintaining critical aspects of that feature within accepted tolerances from their desired values. In lithography, the process window is normally stated by the amount of focus and exposure dose variation that can be tolerated while maintaining feature sizes and critical dimensions (CD) within a given tolerance of their nominal values.

Process windows are typically found by either taking CD measurements on wafers that have been exposed at various focus and exposure conditions, a focus-exposure matrix (FEM), or by computing the CD from through-focus intensity profiles. In the latter case, the exposure dose can effectively be varied by changing the intensity value at which the CD is measured. These intensity profiles are typically generated either by simulation or by recording through an aerial image measurement system (AIMS) that emulates the lithography exposure conditions. AIMS typically consists of a microscope that has a numerical aperture and illumination conditions that emulate the lithography exposure conditions. This system records the aerial image, or the image of the photomask that is projected onto the photoresist by the lithography exposure tool.

Although, the impact of a photomask defect is generally proportional to its area (i.e., size), it is not obvious how the impact of the defect is affected by its location relative to critical features and by other errors that may be present on the critical features, such as CD errors. The pitch of the surrounding features can also affect the printability of a mask error. Because of these unknowns, there is currently no method being practiced to accurately determine the printability of general mask errors. Typically, mask makers attempt to determine the most detrimental conditions and base defect specs on these conditions. Depending on how the specification is set, this may result in many defects being repaired unnecessarily and the possibility of combinations of "in-spec" errors printing out of spec on the wafer.

The two problems previously mentioned: 1) determining the impact of a defect of a certain size and location on the photomask using standard inspection tools, and 2) determining the impact of combining the defect with the critical dimension error using standard inspection tools, were partially addressed in U.S. Pat. application Ser. No. 08/950,620, herein incorporated by is reference, wherein a method for assigning an Equivalent Mask-CD Error (EME) to a defect was described. This equivalent error was found to be directly related to the mask CD uniformity specification, so that defects with an EME larger than the mask CD spec would be repaired and defects with an EME smaller than the mask CD specification would not. Although this method accurately accounts for the multitude of factors that influence the defect printability, it has the drawback of requiring that the aerial image of the defect be found. From a manufacturing perspective, it is desirable to dispose of defects based on parameters that are easily measured on an inspection tool and, currently, inspection tools do not have aerial image capabilities. The defect must, therefore, be measured on AIMS the Aerial Image Measurement System.

FIG. 1a shows the intensity profile through a bright-field isolated line taken at five focus conditions. From this figure, the dimension of the line that prints in the photoresist can be found by drawing a line across the intensity plots at a constant intensity level, (e.g., line 101). Assuming that the photoresist has a threshold response to the light intensity impinging upon it, the printed dimension can be determined by finding the intersections of the intensity curve for a given focus and the constant intensity line, such as points 102 and 103 for the 0.0 μm defocus line, and points 104 and 105 for the 0.5 μm defocus line.

In all the regions where the intensity level exceeds the threshold level, for a positive tone photoresist, the photoresist undergoes a photochemical reaction that allows it to be removed with a developer solution. All the regions having intensities below the threshold level are resistant to the developer solution and remain intact on the wafer after the development process. In FIG. 1a, the intensity of the light reaching the photoresist has been normalized by the intensity of light in a large clear area, 10. In a threshold resist model, if the dose-to-clear (DTC) is defined as the dose required to just develop away a large clear area, then the dose needed to print at a given threshold level is determined by the inverse of the normalized intensity at that threshold multiplied by the DTC. For example, if the exposure dose is given by 4.0*DTC, the normalized intensity at the threshold level is 1/4.0=0.25. It is understood that not all photoresists have a threshold response to the incident light intensity. Nonetheless, most photoresists can be analyzed using a similar method.

Practitioners in the art will fully realize that for an exposure dose set at 4.0*DTC, the threshold for exposure will be 0.25, which approximates the threshold drawn by line 101. For this exposure dose, the size of the line printed in photoresist will be determined by the separation between points 103 and 102, or about 0.25 μm, for the 0.0 μm defocus condition, and by the separation between points 105 and 104, or about 0.17 μm for the 0.5 μm defocus condition. Likewise, for a lower exposure dose set at 2.0*DTC, the exposure threshold will be given by an intensity value of 0.5, which in FIG. 1a corresponds to line 106. Therein, the printed dimension remains basically constant for defocus positions between 0.0 and 0.5 μm. This dimension, approximately 0.35 μm, is defined by the separation between points 108 and 107.

From the CD measurements, one can find functional dependencies of feature size versus focus and exposure dose. FIG. 1b depicts a plot of the line width versus focus at various doses for the isolated line. On this plot, point 111 corresponds to the line width for an exposure dose of 4.0*DTC and a defocus of 0.0 μm, which is equivalent to the separation between points 103 and 102 (FIG. 1a). Likewise, point 112 is the line width for the same dose and defocus of 0.5 μm, which is the separation between points 105 and 104 (FIG. 1a). Points 113 and 114 are the line widths found for a dose of 2.0*DTC at defocus values of 0.0 and 0.5 μm, respectively.

The line width versus focus and dose functions can now be used to determine the amount of focus and dose variation that can be tolerated by the lithography system while maintaining the feature size within the desired tolerance from its nominal size. This is one representation of the process window of the feature. An illustration applicable to an isolated line is depicted in FIG. 1c. Shown therein is the focus value plotted on the vertical axis against the logarithm of the dose on the horizontal axis. Curve 121 represents focus and dose conditions wherein the dimension of the line printed in the photoresist equals the target dimension, 0.25 μm, to which the tolerance is added, e.g., 10% of 0.25 μm or 0.025 μmm. In this case, curve 121 represents the conditions where the line prints at 0.25+0.025=0.275 μm. Curve 122 represents the conditions where the line prints at the target minus the tolerance, i.e., 0.25−0.025=0.225 μm. The region between the curves represents the focus and dose conditions where the line is printed in photoresist within the desired tolerance of its nominal size. Likewise, the common process window of two features can be determined by how much focus and dose variation can be tolerated while still maintaining both features within an acceptable tolerance from their nominal sizes.

The process window for a given tolerance can also be stated as the amount of focus variation that can be tolerated, commonly referred to as the depth-of-focus (DOF), and which is a function of the amount of exposure dose variation, or exposure latitude (EL). FIG. 1d shows a representation of the process window for the isolated line. This curve is often found by determining the largest rectangles that are contained within the positive and negative tolerance lines shown in FIG. 1c. In this case, the horizontal dimension of the rectangle corresponds to a given dose variation. The vertical dimension represents the amount of focus variation that can be tolerated when the given amount of dose variation is present while maintaining the line width within tolerance. In FIG. 1c, rectangle 123 represents a 25% dose variation, and its vertical dimension corresponds to a focus variation of 0.6 μm. In FIG. 1d, point 124 corresponds to a 0.6 μmm DOF at 25% EL. Since it is more convenient to specify a process window in terms of a single number, the process window will often be specified as either the depth of focus at 10% exposure latitude or the amount of area under the DOF versus the EL curve, which is commonly known as the total window. Other values can also be used as a measure of the process window.

FIG. 2 outlines a conventional process used by a device manufacturer to set a mask defect specification followed by the mask manufacturer using that specification during the inspection/repair process.

In the conventional process that defines a defect specification, the device manufacturer determines the wafer nominal CD and CD tolerance by analyzing the semiconductor device requirements. However, the mask CD tolerance is normally set as only some fraction of the wafer CD tolerance (204). By way of example, the mask CD tolerance is often set at one-third times the exposure tool magnification of the wafer CD tolerance, or 4/3 times the wafer CD tolerance for a 4× exposure tool. Accordingly, if the wafer CD tolerance is 30 nm, the mask CD tolerance will be set at 40 nm for a 4× mask. This fractional method is based on apportioning a certain fraction of the total error budget to different parts of the process. Herein, the mask error is allocated one-third of the total error budget, variations in the lithography process are allocated another one-third, and all remaining process variations are apportioned the final third. This method is generally valid for printing features having a k1 factor larger than about 0.5, wherein:

k1=feature size*stepper numerical aperture/wavelength of the exposure illumination.

The method of allocating an error budget becomes invalid for imaging where k1 drops below 0.5 due to the amplification of mask errors by the lithographic process.

Still referring to FIG. 2, mask defects are, typically, only specified by their size, and this size is taken as a fraction of the nominal mask critical dimension (206). For instance, it is normal to consider as defects any undesired structures on the mask having a dimension greater than 10% of the nominal mask dimension. For a mask with nominally 1.2 μm features, all undesired features that are larger than 120 nm are considered defects. Since the wafer CD tolerance specification for these types of features is usually about 10% of the nominal wafer dimension, the wafer CD tolerance for these features will be approximately (1.20 μm/4)*0.1 =30 nm. Then, the mask CD specification is typically set at 4/3×30=40 nm. This indicates that the defect criterion does not correlate well to the mask CD specification. By allowing the defect specification to be larger than the CD specification, the device manufacturer has traditionally supported the concept that defects do not impact the wafer image as much as a CD variation. The conventional method of quantifying this concept is, however, somewhat arbitrary.

The standard mask inspection/repair process entails incorporating the defect size criterion of the device manufacturer into the inspection tool (208). The tool then locates all undesired features that are larger than that predetermined defect size. Each defect is then reviewed and classified. If a defect is considered non-repairable, then a judgment call (211) is made to establish whether or not the defect will print on the wafer. Advanced mask makers may utilize the AIMS tool to facilitate this process, but it is standard practice with an AIMS review to base this decision strictly on a comparison of the peak intensity values for defective and non-defective features. The behavior of the defect at various dose and focus conditions is not normally considered. If the defect is not repairable and is believed to negatively impact a critical feature on the wafer, the mask is routinely scrapped (212). After review, all repairable defects are typically repaired (210) and the mask finished and shipped (214).

OBJECTS OF THE INVENTION

It is an object of the present invention to provide a method of determining whether a defect that is detected by a photomask inspection tool will adversely affect the wafer.

It is another object of the present invention to provide a method of relating defect specifications directly to device performance and wafer yields.

It is still another object of the invention to provide a method for determining the impact of combining the defect with the critical dimension error using standard inspection tools.

It is a further object of the invention to increase mask yields, improve turn-around-time, and reduce mask costs.

SUMMARY OF THE INVENTION

In accordance with one aspect of the present invention, there is provided a method of determining the Equivalent Mask-CD Error (EME) for a defect that is based on the area of the defect and its location relative to the edge of a critical feature. For phase defects, the phase and transmission of the defect should also be known. The EME is found using previously computed mathematical relationships between the EME and the defect parameters. These relationships can be found through simulation, through AIMS or through wafer analysis of real defects. Determining these relationships is one aspect of this invention.

In another aspect of the invention, once the EME for the defect is computed, this number can be directly added to the measured CD error of the feature close to it, in order to determine the Total Mask Error (TME) for the defect/CD error combination. In this manner, the impact of the defect on the wafer image can be arrived at without an aerial image measurement or simulation. The only measurements that are necessary are physical quantities (i.e. defect area and location, along with feature size) that are easily measured on a standard mask inspection system. Although this is an approximate method, it is quite accurate over the range of defect sizes that are the most difficult for the defect disposition. In this range, the defect causes CD variations on the wafer that change depending on the process conditions that are used to expose the wafer. However, the defect will not likely cause a catastrophic failure.

The accuracy of this method breaks down for defects that are very small and do not cause any significant variation on the wafer. But these defects are known to not be a problem and standard disposing will always allow these defects to go unrepaired. Likewise, the accuracy degrades for larger defects where catastrophic failures, such as the merging of two features, are likely. But, again, standard disposing will always require that these defects be repaired.

BRIEF DESCRIPTION OF THE DRAWINGS

While the specification concludes with claims particularly pointing out and distinctly claiming what is regarded as the present invention, details of several preferred embodiments of the invention may be more readily ascertained from the technical description when read in conjunction with the accompanying wherein:

FIG. 1c illustrates a conventional plot showing a feature process window as it applies to the isolated line example of FIG. 1b;

FIG. 7 is a flow chart of showing an overview of the steps required to determine if a defect that was detected by a photomask inspection tool will adversely affect the wafer, in accordance with the present invention.

DETAILED DESCRIPTION OF THE INVENTION

Figure 1A:
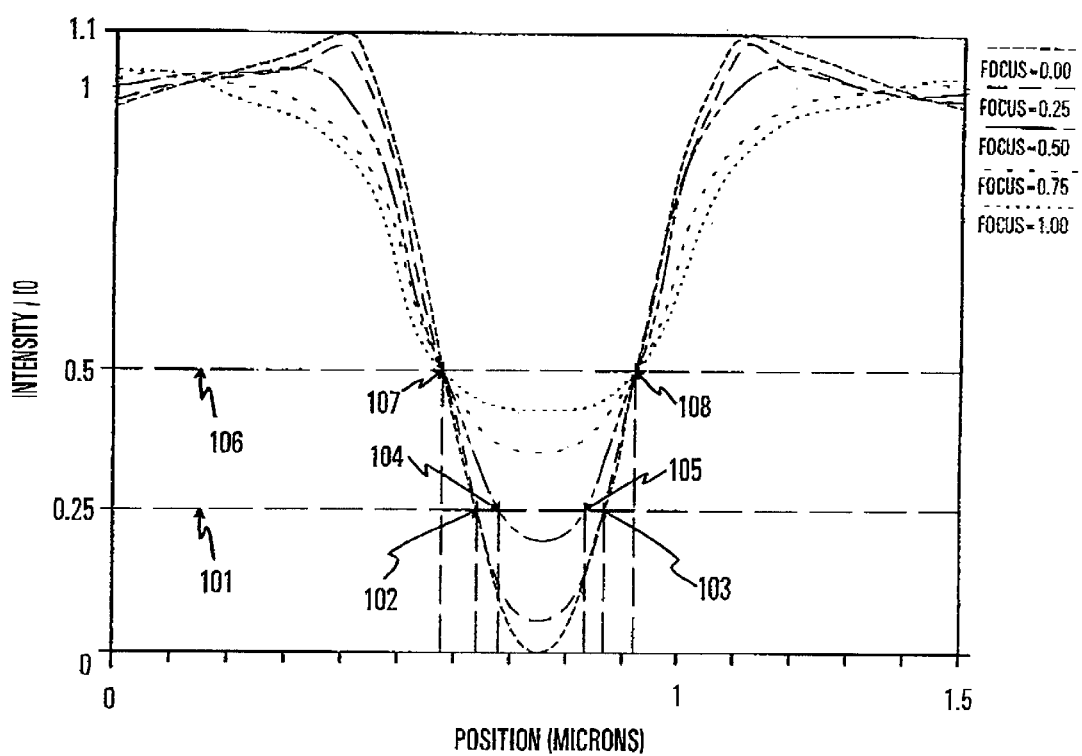
FIG. 1a shows a conventional plot of the intensity profile that would exist at the wafer for a bright field isolated line pattern on a photomask taken under five focus conditions.
Figure 1B:
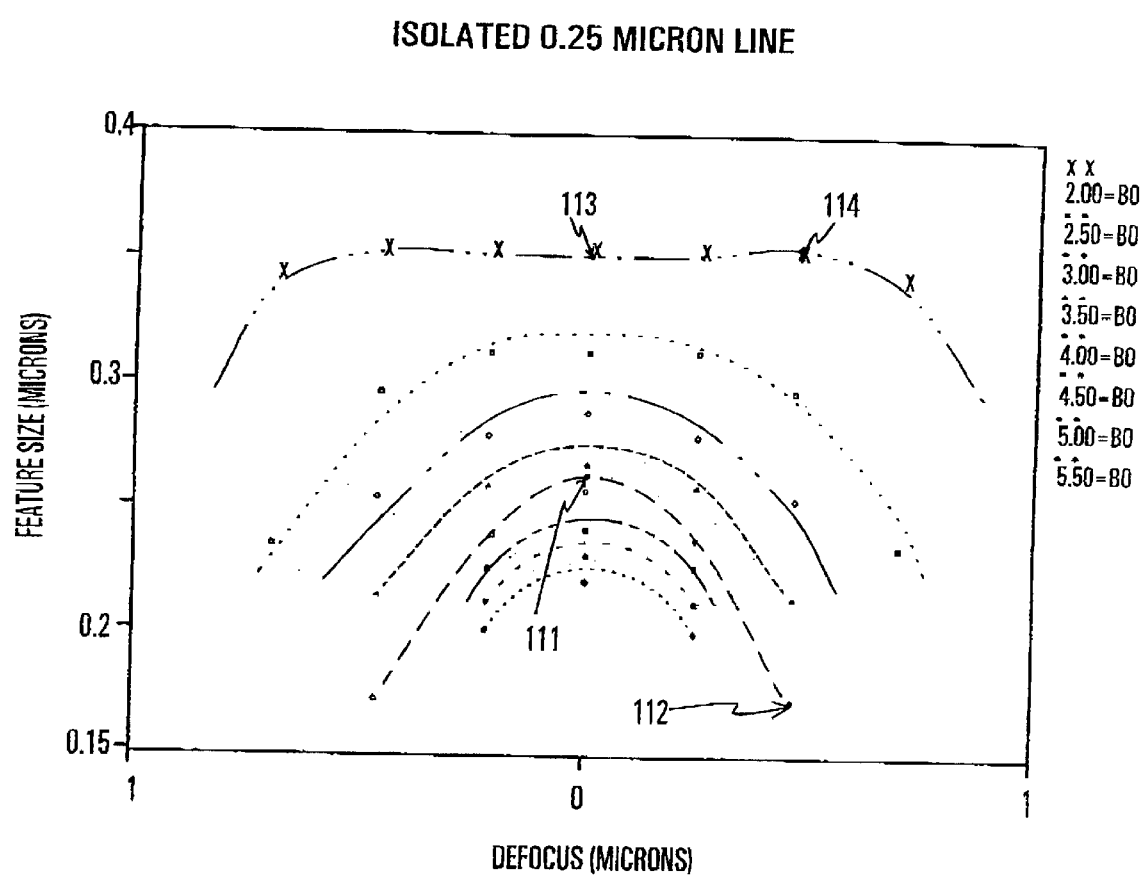
FIG. 1b is a conventional plot of the line width versus focus for various doses applied to the isolated line.
Figure 1D:
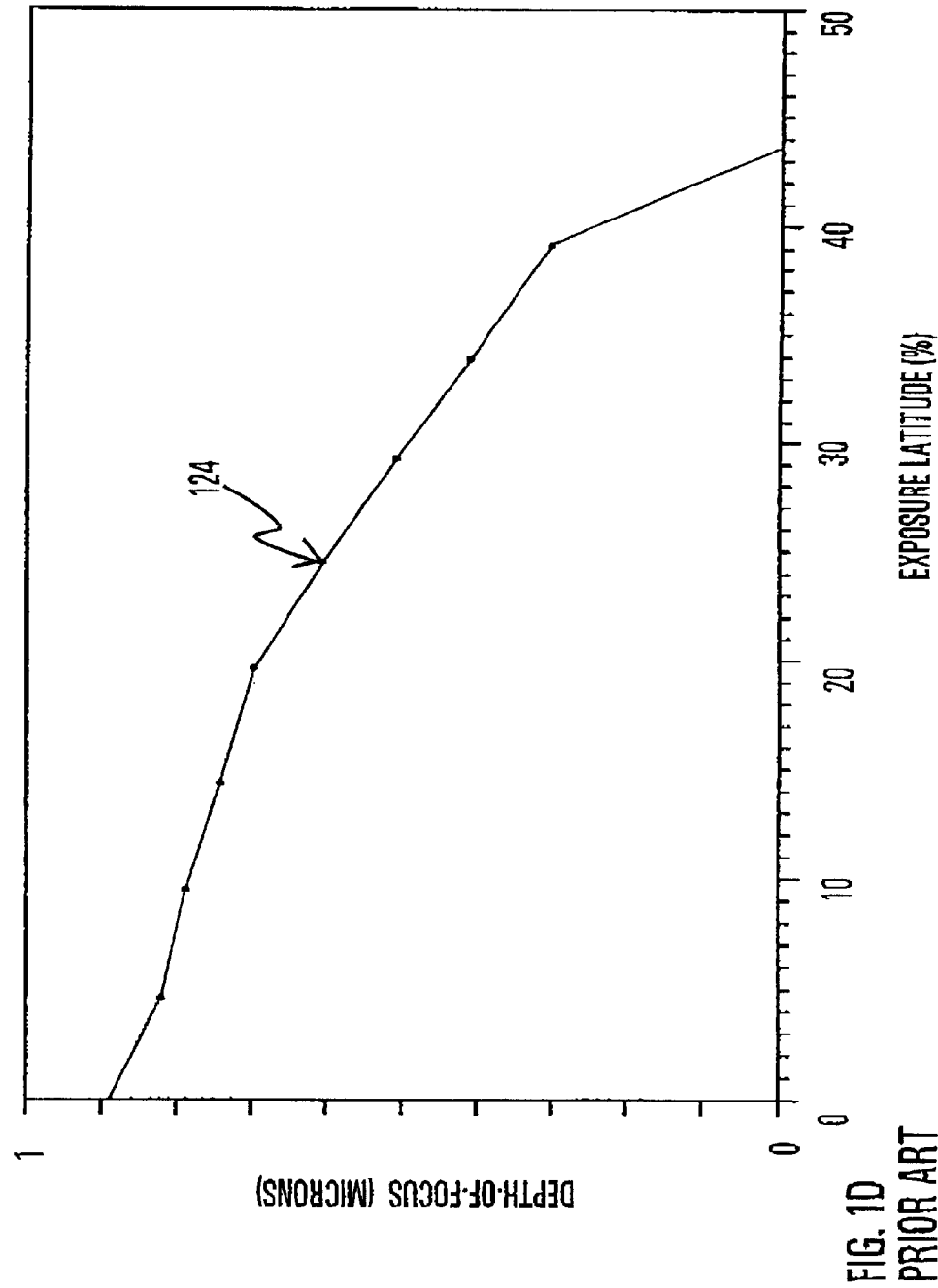
FIG. 1d shows a conventional representation of the process window for the isolated line, in which the depth of the focus is plotted against exposure tolerance.
Figure 2:
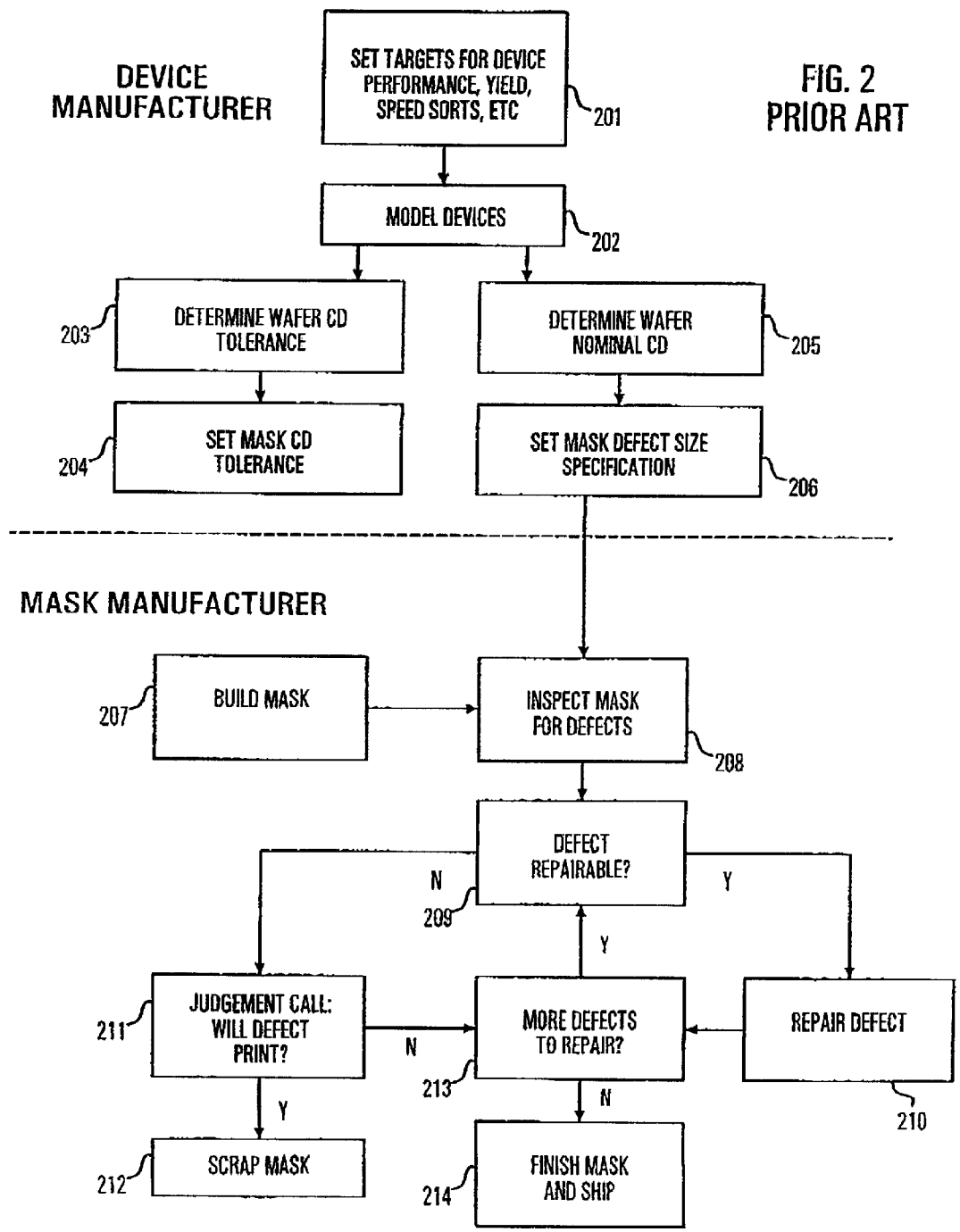
FIG. 2 is a flowchart that outlines a prior art process used by a device manufacturer to set a mask defect specification and for a mask manufacturer to utilize the specification as it used in a conventional inspection/repair process.

In the present invention, the printability of a defect is determined by assigning to it an equivalent mask CD error. The EME is obtained by measuring the area and location of the defect followed by applying a set of mathematical relationships. By determining the EME based on standard size and location measurements, and by not relying on aerial image measurements, the number of steps required to dispose of a defect are significantly reduced, making it possible to dispose of the mask using a standard defect review process.

The aforementioned second problem is also solved by adding the different error components, such as mask CD error and EME, resulting in a single metric for the mask error, hereinafter referred to as the Total Mask Error (TME). The final disposition of the mask is based solely on the value of TME. This technique is perfectly general and can be applied to features that include various combinations of errors. By way of example, for a feature without a defect, the TME is the same as the CD error; with a defect, the TME is the sum of the CD error and EME. This makes it possible to treat all types of mask errors (undersize, oversize, pinhole, pin-spot, etc.) in the same manner. The benefit of this approach is that it converts the effects of any mask error (including CD errors and defects) into a value that adds linearly with other errors. This allows the impact of combinations of errors to be computed based on standard measurements of the individual errors.

The method that is described herein can be broken into two major sections as shown in FIG. 7. The first deals with determining the functional relationships between measurable defect parameters and equivalent mask CD errors (EME). The second section deals with utilizing these relationships to determine the Total Mask Error for a combination of defects based on the measured values for those defects. The first section falls above the line, 716, and the second falls below the line in FIG. 7.

EME Curves

The determination of EME curves is essentially an extension of the previously referred U.S. Patent Application. Therein, is described how EME for a defect can be obtained by finding the common process window of the defective feature with a non-defective feature. Utilizing a predetermined relationship giving EME as a function of common process window, the EME can be computed for the defect. The precomputed function was preferably determined by simulating mask CD errors and finding the functional dependence of common process window on the amount of mask CD error, 701. This function was then inverted to give the desired function of mask CD error on common process window, 702.

In the present method, various defects close to a reference structure are simulated, 703. This reference structure is generally a simple mask structure such as an isolated line. Defects of different types, sizes and locations relative to the reference structure are simulated. The simulations are performed over a range of focus steps and the intensity images are stored. Images of the defective structures, along with the nondefective reference structure, are then used to find the common process windows of the defective structures with the nondefective structure, 704. These common process windows are then used to compute EME for each defect, 705, as if it had been a physical defect measured on an AIMS tool.

Functional relationships are then applied for the EME as a function of the relative measurable parameters of the defect, 706. For a typical opaque defect, the EME value is a function of size and location from the edge of the line. For a given location, the EME for this defect approximates very well a quadratic function of the defect size as expected, based on the traditional belief that the impact of a defect depends on its area. The impact of most defects also falls off as an exponential of the location squared. Other, more complex defects, may have EME as a function of size, location, phase and transmission. The simplest defect is an image size defect, wherein the line is larger or smaller than desired. The EME for this defect is exactly the difference in size from the desired size.

The EME functional curves can be generated for all the different measurable defect types. They include: opaque in clear, clear in opaque, opaque in attenuator, attenuator in clear, phase error, phase spot, image size, registration and so on. The functional relationships are determined by best fitting the EME values to all of the measurable parameters, such as: size, location, phase, transmission, etc. The novelty of generating curves in this manner is that in most cases, these curves are independent of the mask pattern and lithographic conditions that were used in a defect simulation. This is due to the impact of a defect generally scaling linearly with the Mask Error Factor (MEF) of the mask pattern. Since, by definition, the impact of a mask CD error also scales linearly with MEF, relating the defect to an equivalent mask CD error results in an essentially universal defect curve for each defect type. Because of this, only a small number of defect curves need to be generated and kept at the inspection tool to determine the EME of a measured defect.

TME Calculation

Having generated the appropriate EME curves, it is straightforward to determine the combined effects of various types of defects. First, all defects are found using standard inspection equipment, 707. Standard measurements are then taken of each defect, preferably on the inspection tool as part of a review process, 708. EME values are computed for all features close to each of the defects, 709–710. Finally, the Total Mask Error is computed, 711.

TME for a feature located at point $(x_o, y_o)$ is given by:

$$\text{TME}(x_o, y_o) = \Sigma_n \text{EME}_n(x - x_o, y - y_o)$$

where $\text{EME}_n(x,y)$ is the EME of the $n^{th}$ defect and N is the total number of defects that were found. Since the EME drops off rapidly with distance from a feature, in practice, the summation is generally taken only over one or two defects. The worst case location $(x_o', y_o')$ can be found by the partial derivatives with respect to $x_o$ and $y_o$ and by setting the result equal to 0 at $x_o = x_o'$ and $y_o = y_o'$. This system of equations can then be solved for $x_o'$ and $y_o'$.

The simplicity of this method stems from the power of the EME methodology. Firstly, EME functions normalize the impact of the various defect types down to a standard unit. This normalization accounts for pattern and lithography process dependencies. Second, since many of the defect types act, at least approximately, independently of each other, their effects can be directly added.

Once the TME is computed, then the defect can be disposed of, 712–715. This is accomplished by comparing it to the mask CD uniformity specification for the given type of feature. Thus, if the semiconductor device manufacturer requires tighter mask CD specifications on mask patterns that have a higher MEF than regions having a lower MEF, the defect specification is adjusted accordingly.

Examples

The defect disposing method will be better understood by reference to some examples. For simplicity sake, a standard Chrome-On-Glass (COG) mask containing line/space patterns of various pitches will first be considered. This mask type is susceptible to three types of defects: opaque defects in clear regions, clear defects in opaque regions, and size errors. These results can be extended to defects on an Attenuated Phase Shift Mask (APSM) and to some defect types on an Alternating Phase Shift Mask.

Figure 3A:
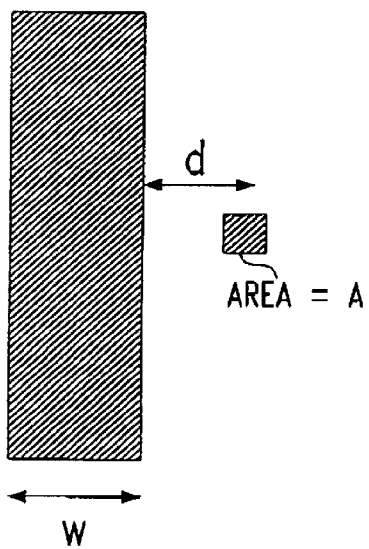
FIGS. 3a–3c show three typical types of defect: opaque on clear, clear on opaque and size error.
Figure 3B:
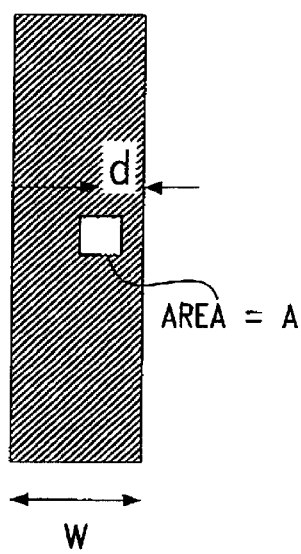
Figure 3C:
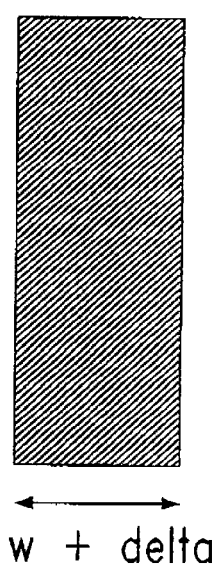

The first step consists in simulating various defect types. In FIG. 3, the defects are shown as they relate to an isolated line. Other patterns may also be used advantageously. The OIC and CIO defects are simulated at various distances from the line edge and at various sizes, as a function of area. The size error defect need not be simulated, as its EME will exactly equal the size error. EME is then computed for each defect. This results in the curves shown in FIG. 4, wherein EME as a function of defect area is plotted for several defect locations. The best fit curves for these plots gives:

$$EME=m(d)*area$$

where $m(d)=c*\exp(-k*d^2)$.

For OIC: c=1.44 1/um and k=4.94 $1/um_2$.

For CIO: c=−1.53 1/um and k=3.63 $1/um^2$.

Likewise, $$EME=\Delta,$$

wherein $\Delta$ is the size error.

Figure 4A:
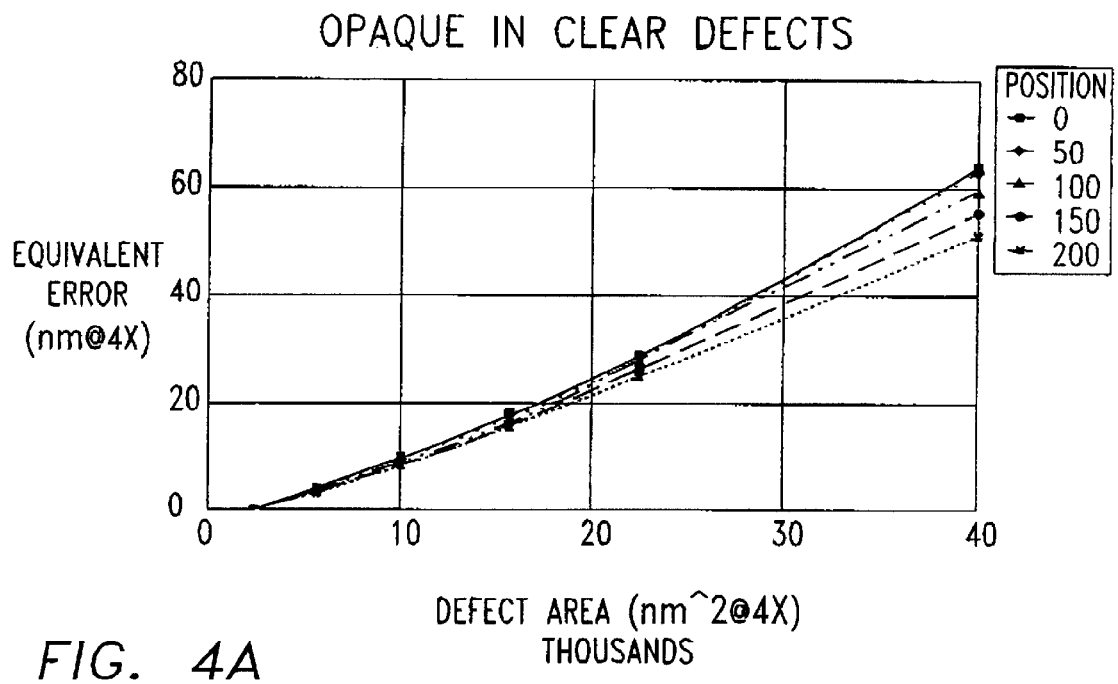
FIGS. 4a–4b are two conventional plots of the equivalent error versus defect area corresponding to opaque in clear defects and to clear in opaque defects.

The EME functions are kept at the inspection tool where they can be used to evaluate the printability of various defects. If, for example, defects such as those shown in FIG. 4a are discovered by the inspection tool, their combined effect can be computed. Here, an opaque defect with an area of 0.01 $um^2$ is found to be centered 0.1 um from the edge of a semi-nested line. Line #1 is nominally 0.700 um wide, but measures 0.750 um wide. EME for the OIC defect is found to be:

$$EME=(1.44*\exp(-4.94*0.1*0.1))*(0.01\ um^2)=0.014\ um$$

and EME for the size error is given by:

$$EME=0.750-0.700=0.050\ um,$$

so that the total mask error for line #1 is given by:

$$TME=0.014+0.050=0.064\ um.$$

Now, if the mask CD uniformity specification is 0.060 um and the minimum defect area specification is 0.015 $um^2$, then both of these defects will remain within their specification, but the combination will be out of specification.

Figure 4B:
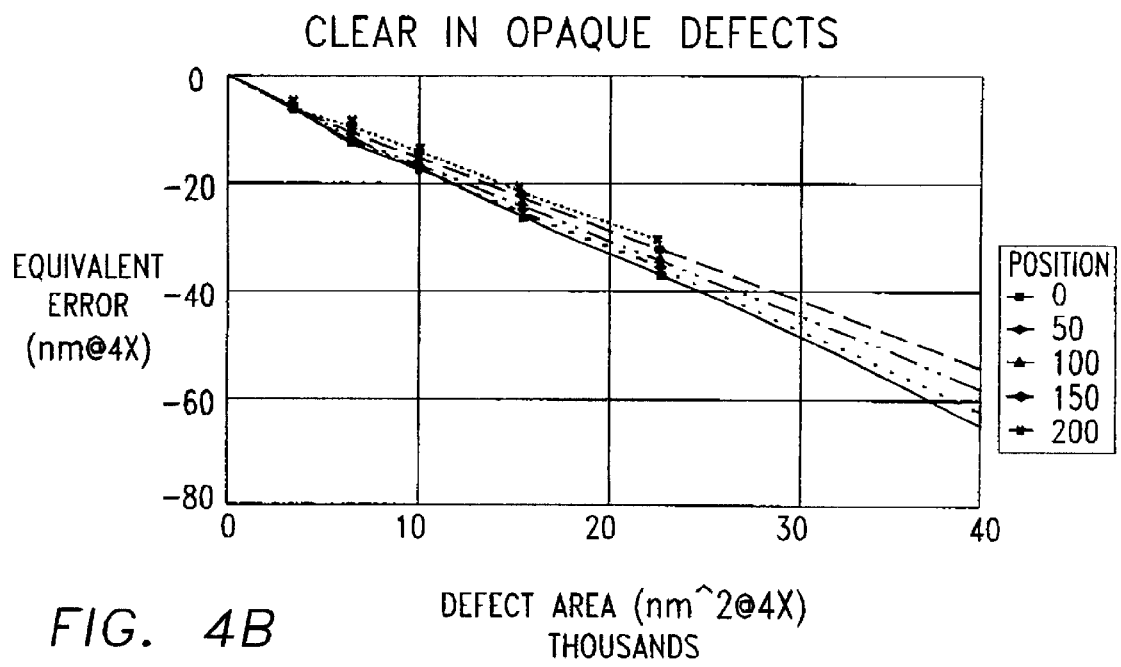

Alternatively, in FIG. 4b, a larger OIC defect with an area of 0.02 $um^2$ is found centered a distance of 0.1 um from the edge of an undersized line measuring 0.650 um wide. Now, the EMEs are given by:

$$OIC: EME=(1.44*\exp(-4.94*0.1*0.1))*(0.02\ um^2)=0.028\ um$$

$$Size: EME=0.650-0.700=-0.050\ um$$

so that $$TME=0.028-0.050=-0.022\ um.$$

Traditionally, such an OIC defect would be considered out of specification and would be sent for repair. However, the combination of line width error with the OIC defect will actually be within specification using the TME method.

Figure 5A:
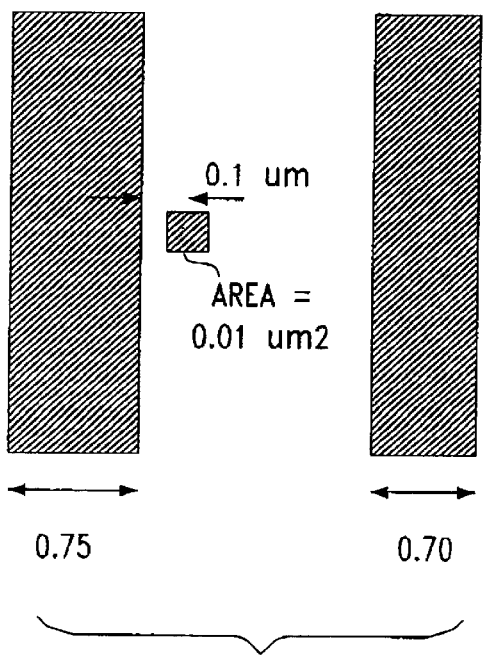
FIGS. 5a–5b show an example of an out-of spec defect and in-spec defect.
Figure 5B:
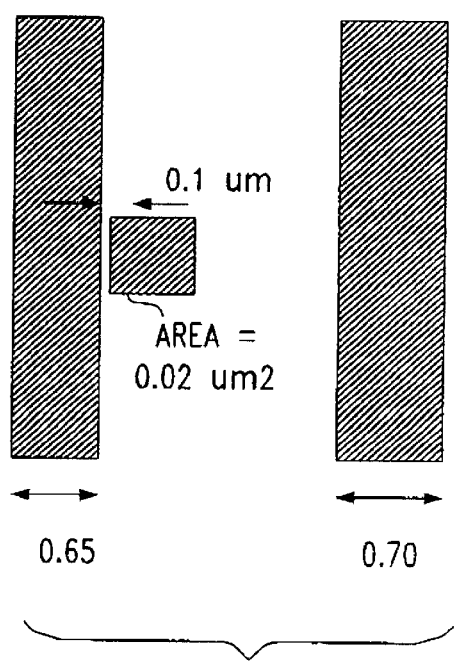
Figure 6:
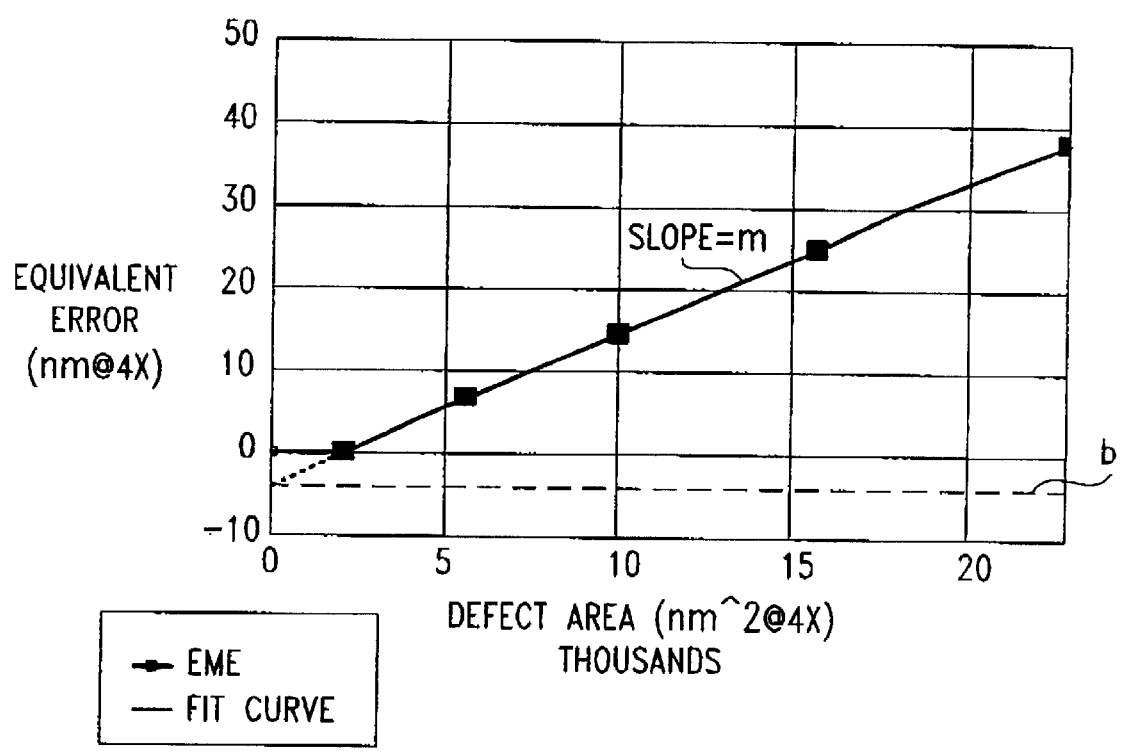
FIG. 6 is a plot of the equivalent error versus defect area corresponding to an attenuator in clear defect.

Defects on an Attenuated Phase Shift Mask (APSM) can be disposed of based on simple modifications to the COG cases. Herein, coherent effects lead to more complex relationships for the impact of the defect as a function of its location and size. However, over the range of defect sizes that are important for the disposing algorithm. Their behavior can be approximated by a linear function area that has a slope that drops off exponentially with the square of the distance from a feature. Allowing this function to have a non-zero y-intercept results in a better curve fit over the defect sizes of interest. In this case, infinitely small defects may appear to introduce a mask error. This can be corrected by forcing the EME curve to 0 for all defect sizes smaller than the size where the EME curve crosses the axis (EME=0). This is shown in FIG. 5, where the EME curve is set to 0 for all defects that are smaller than approximately 2200 $nm^2$.

The best fit curves for EME as a function of size and location are now given by:

$$EME=m(d)*area+b$$

where $m(d)=c\exp(-k*d^2)$ and b is the y-intercept. For OIC defects on an APSM, typical values are:

C=1.56 1/um, k=3.33 $1/um^2$ and b=−0.0046 um.

It should also be noted that the accuracy of the curve fit can be improved by adding a correction term to the slope, such that:

$$m(d)=c*\exp(-k_1*d-k_2*d^2).$$

Further refinements are possible, but are not likely to improve the accuracy any further for general structures.

While the invention has been particularly shown and described with reference to a single preferred embodiment, it will be recognized by those skilled in the art that modifications and changes may be made to the present invention without departing from its intended scope. Merely by way of example, photomasks using OPC or subresolution assist features may have special defect types that have not been clearly specified here. These types may comprise various defects on the assist or OPC features and their EME values will be considered errors on the critical features. The EME curves for these defects may differ significantly from their corresponding defects located on or near the critical features. Therefore the scope of the invention should be determined not with reference to the above description but with reference to the appended claims along with their full scope equivalents.

What is claimed is:

1. A method for determining if an undesirable feature on a photomask will adversely affect the performance of a semiconductor device On a wafer, said device being created by said photomask through a lithographic process, said method comprising the steps of:

(a) inspecting said photomask for defects;

(b) measuring the size and location of said defects relative to features on said photomask;

(c) classifying said defects by type of defect;

(d) assigning an equivalent mask critical dimension error (EME) value to each of said features based on said size, said location and said type of defect, wherein said EME value for each defect is assigned by the equation:

$$EME\ C*\exp(-K*d*d)*a+B$$

wherein d is the distance of said defect from an edge of said feature, a is the area of said defect, and B, C, K are constants;

(e) assigning a total mask error to each of said features by adding individual ones of said EME values for each of said defects impacting said features; and (f) comparing said equivalent critical dimension error to a mask critical dimension error tolerance to determine whether said defects adversely affect the performance of said semiconductor device.

2. The method as recited in claim 1, wherein said EME value is based on a functional relationship for said defect type, said relationship consisting of measurable parameters selected from the group consisting of size, location relative to said features, phase and transmission.

3. The method as recited in claim 2, wherein said relationships are precomputed and are first generated for a test structure and then generalized to other ones of said features on said photomask.

4. The method as recited in claim 3, wherein said test structure is an isolated line.

5. The method as recited in claim 2, wherein said precomputed relationships are determined for a first photomask type and then used for a second one of said photomask type.

6. The method as recited in claim 1, wherein said photomask is a binary photomask made of substantially opaque regions on substantially clear regions.

7. The method as recited in claim 1, wherein said defect types comprise: clear in opaque, opaque in clear, critical dimension error and registration error.

8. The method as recited in claim 1, wherein said photomask is an attenuated phase shifting photomask.

9. The method as recited in claim 8, wherein defects in said attenuated phase shifting photomask are classified by defect types, said defect types comprising: clear in attenuator, attenuator in clear, opaque in attenuator, opaque in clear, phase error, transmission error, critical dimension error and registration error.

10. The method as recited in claim 1, wherein said photomask is an alternating phase shifting photomask.

11. The method as recited in claim 10, wherein defects in said alternating phase shifting photomask are classified by defect types, said defect types comprising: clear in opaque, opaque in clear, phase bump, phase hole, phase error, transmission error, critical dimension error and registration error.

12. The method as recited in claim 1, wherein said defect types include: clear in opaque, opaque in clear, clear in attenuator and attenuator in clear.

13. The method as recited in claim 1, wherein said B, C, and K are precomputed constants.

14. The method as recited in claim 13, wherein the photomask is a binary photomask and B=0.

15. The method as recited in claim 13, wherein the photomask is an attenuated phase shifting photomask and B is allowed to be different from zero.

16. The method as recited in claim 15, wherein B<0.

17. The method as recited in claim 13, wherein said defect type is classified as opaque in clear, and $1.3\ um^{-1} < C < 1.7\ um^{-1}$ and $2.0\ um^{-2} < K < 6.0\ um^{-2}$.

18. The method as recited in claim 13, wherein said defect type is classified as clear in opaque, and $-1.3\ um^{-1} < C < -1.7\ um^{-1}$ and $2.0\ um^{-2} < K <$ to $6.0\ um^{-2}$.

19. The method as recited in claim 13, wherein said defect type is classified as clear in attenuator, and $-1.3\ um^{-1} < C < -1.7\ um^{-1}$ and $1.0\ um^{-2} < K < 5.0\ um^{-2}$.

20. The method as recited in claim 13, wherein said defect type is classified as opaque in attenuator and C is in the range $-1.0$ to $1.0\ um^{-1}$ and K is in the range 20.0 to $40.0\ um^{-2}$.

21. The method as recited in claim 12, wherein the EME for each defect is assigned using the equation:

$$EME = C^* \exp(-K_1^* d - K_2^* d^* d)^* a + B$$

wherein d is the distance of the defect from the edge of the feature, a is the area of the defect, and B, C, $K_1$ and $K_2$ are precomputed constants.

22. The method as recited in claim 1, wherein said TME value at location $(x_o, y_o)$ is computed according to $$TME(x_o, y_o) = \sum^{N} EME_n(x - x_o, y - y_o)$$

wherein $EME_n(x,y)$ is the EME of the $n^{th}$ defect and N is the total number of defects that were found.

23. The method as recited in claim 22, wherein the summation is only carried out over a small subset of defects that are close to location $(x_o, y_o)$.

24. The method as recited in claim 22, wherein the worst case location $(x_o', y_o')$ is found by taking partial derivatives with respect to $x_o$ and $y_o$ and setting the result equal to 0 at $x_o = x_o'$ and $y_o = y_o'$. This system of equations then being solved for $x_o'$ and $y_o'$.

25. The method as recited in claim 1, wherein said photomask contains optical proximity correction or subresolution assist features.

26. The method as recited in claim 25, wherein said features consist solely of features that exist in the design of said photomask and that are supposed to be printed on said wafer.

27. The method as recited in claim 25, wherein said features consist of both features that are supposed to be printed on said wafer and features that exist in the design data for said photomask but are not supposed to be printed on said wafer.

* * * * *